(12) United States Patent
Wu

(10) Patent No.: US 6,872,621 B1
(45) Date of Patent: Mar. 29, 2005

(54) METHOD FOR REMOVAL OF HEMISPHERICAL GRAINED SILICON IN A DEEP TRENCH

(75) Inventor: Yung-Hsien Wu, Taipei (TW)

(73) Assignee: Promos Technologies Inc., Hsinchu (TW)

(*) Notice: Subject to any disclaimer, the term of this patent is extended or adjusted under 35 U.S.C. 154(b) by 0 days.

(21) Appl. No.: 10/758,624

(22) Filed: Jan. 14, 2004

(30) Foreign Application Priority Data

Nov. 6, 2003 (TW) .......................... 92131135 A

(51) Int. Cl.$^7$ .................. H01L 21/8242; H01L 21/331
(52) U.S. Cl. .................. 438/243; 438/245; 438/246; 438/247; 438/249; 438/386; 438/389; 438/392
(58) Field of Search ............... 438/243, 245, 438/246, 247, 249, 386, 389, 392

(56) References Cited

U.S. PATENT DOCUMENTS 6,177,696 B1 * 1/2001 Bronner et al. ............. 257/301

2004/0079979 A1 * 4/2004 Lee et al. ..................... 257/301

* cited by examiner

Primary Examiner—Olik Chaudhurl
Assistant Examiner—William M. Brewster
(74) Attorney, Agent, or Firm—Pro-Techtor International Services

(57) ABSTRACT

A method for removal of hemispherical grained silicon (HSG) in a deep trench is described. A buried silicon germanium (SiGe) layer serving as an etch stop layer is formed in the collar region of the trench, followed by depositing a HSG layer. The HSG layer is then successfully striped by wet etching with a potassium hydroxide/propanone/water etchant, that is, without damage to the trench sidewalls, since a good etch rate selectivity between the HSG layer and the SiGe layer is obtained by the wet etchant. In addition, no etch stop layer exists between the HSG layer and the bottom of the trench when manufacturing trench capacitors in accordance with the method; capacitance degradation is therefore not of concern.

21 Claims, 3 Drawing Sheets

METHOD FOR REMOVAL OF HEMISPHERICAL GRAINED SILICON IN A DEEP TRENCH

FIELD OF THE INVENTION

The present invention relates to a method for removal of hemispherical grained silicon, and more particularly, to a method for removal of hemispherical grained silicon in a deep trench through a silicon germanium (SiGe) etch stop layer.

BACKGROUND OF THE INVENTION

Recently, the semiconductor industry has developed so rapidly that semiconductor devices almost extend into the sub-micron level. When either increasing integration density of a device or reducing its chip area, it becomes crucial to maintain an unchanged capacitance per cell especially for dynamic random access memory (DRAM) scaling. The lower limit for capacitances of storage capacitors is currently considered to be at least 25 fF.

Increasing the surface area of a capacitor and implementing of high-k dielectrics would improve the performance of capacitance. A promising material, hemispherical grained silicon (HSG), has been extensively used to increase the surface area of a capacitor and also has been widely applied to stacked DRAMs. However, employing HSG in trench DRAMs is not feasible, because the physical property of HSG is quite similar to that of single crystalline silicon, which would cause inevitable damage of trench sidewalls while removing the upper part of the HSG layer in the deep trench by wet etching.

Growing an etch stop layer before forming a HSG layer may solve the problem mentioned above. Unfortunately, any etch stop layer existing between the HSG layer and the trench would deteriorate capacitance enhancement due to the parasitic series capacitance thereof. In attempted resolution of this issue, some processes have been studied to integrate successfully HSG into trench DRAMs. One of the commonly used processes is to employ an oxide layer as an etch stop layer. In this process, an oxide layer is formed on the bottom and two sides of the trench prior to a HSG layer, and several steps are subsequently performed to strip off the oxide layer on the bottom of the trench, that is, to keep the oxide layer on only the top part of the trench. Nevertheless, the process is very complicated and therefore quite difficult.

SUMMARY OF THE INVENTION

The objective of the present invention is to provide a method for removal of the HSG layer in a deep trench but without damaging the trench sidewalls, as well as a method for maintaining or raising the capacitance per cell after incorporating HSG into trench DRAMs.

According to the aforementioned objective of the present invention, on the one hand, a method for removal of HSG layer by wet etching through a silicon germanium (SiGe) layer is provided. A potassium hydroxide (KOH)/propanone/water mixture is used as an etchant to recess the HSG layer. Once the buried SiGe layer is formed before the HSG layer, the HSG layer is successfully recessed and no damage is done to the trench sidewalls due to the high selectivity between the SiGe layer and the HSG layer by the etchant. Also the roughness of the trench sidewalls after removing the HSG layer is still acceptable for subsequent processes. The buried SiGe layer, moreover, decreases the BS resistance owing to its enhancement of the dopants activities in the buried strap (BS) region.

According to the aforementioned objective of the present invention, on the other hand, a buried SiGe layer formed before a HSG layer is served as an etch stop layer. The buried SiGe layer can be formed only on the collar region of the trench by implanting germanium atoms into the silicon trench with a predetermined angle. As a result, there is no etch stop layer between the trench and the HSG layer; the capacitance per cell can therefore be maintained or even raised. Furthermore, the etch stop layer can be formed selectively on the upper part of the trench, so other steps to remove that layer on the lower part of the trench are unnecessary, which effectively simplifies the technique to integrate HSG into current manufacturing processes of trench DRAMs.

BRIEF DESCRIPTION OF THE DRAWING

The foregoing aspects and many of the attendant advantages of this invention will become more apparent by reference to the following detailed description, when taken in conjunction with the accompanying drawings, wherein.

DETAILED DESCRIPTION OF THE PREFERRED EMBODIMENTS

The embodiment in accordance with the present invention is disclosed in detail as following, when taken in conjunction with the accompanying drawings.

Figure 1A:
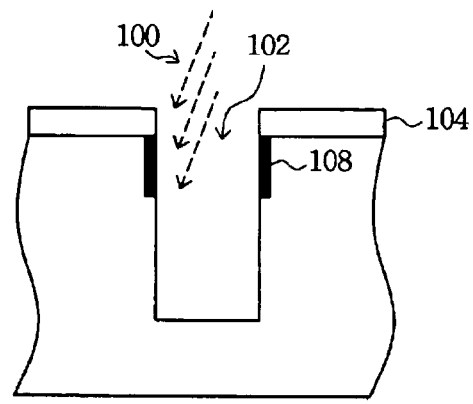
FIGS. 1A–1H illustrate schematic, cross-sectional views of various stages of removing a hemispherical grained silicon layer in accordance with the preferred embodiment of the present invention.

FIG. 1A illustrates a cross-sectional view of a substrate with a pad 104 and a trench 102 structure. A buried silicon germanium (SiGe) layer 108 is used as an etch stop layer. The buried SiGe layer 108 is formed in the collar region of the trench 102, as shown in FIG. 1A, by implanting 100 germanium atoms into the silicon trench 102 with a predetermined angle and followed by rapid thermal annealing. The predetermined angle is preferably from about 8 degrees to about 12 degrees, but most preferably is about 10 degrees. The SiGe layer 108 can be selectively formed on only the upper part of the trench 102 by controlling the implanting angle. Other steps to remove that layer on the lower part of the trench 102 are consequently unnecessary, which effectively simplifies the process. In addition, the buried SiGe layer 108 enhances activities of dopants in the buried strap (BS) region, which decreases the BS resistance and also increases the driving current. On the other hand, the buried SiGe layer 108 is further used as a mask. As proceeding wet etching a trench, the buried SiGe layer 108 can protect the upper part of the trench from etching in order to form a bottle-shape trench.

Figure 1B:
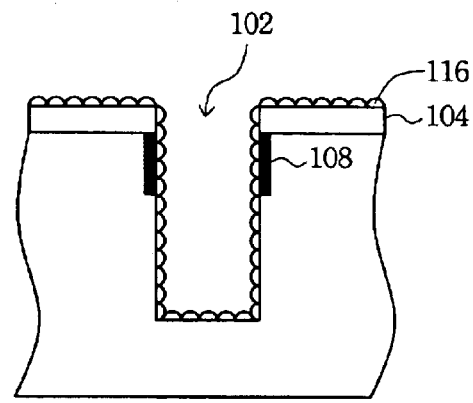
Figure 1C:
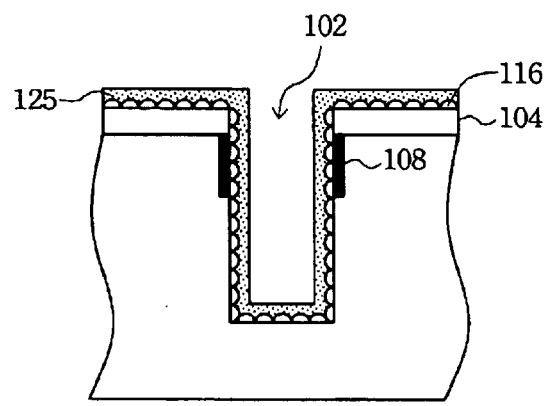

Referring to FIG. 1B and FIG. 1C, a hemispherical grained silicon (HSG) layer 116 is formed on the buried SiGe layer 108 and the trench 102, and subsequently an arsenic silicon glass (ASG) layer 125 is formed on the HSG layer 116 through deposition processes.

Figure 1D:
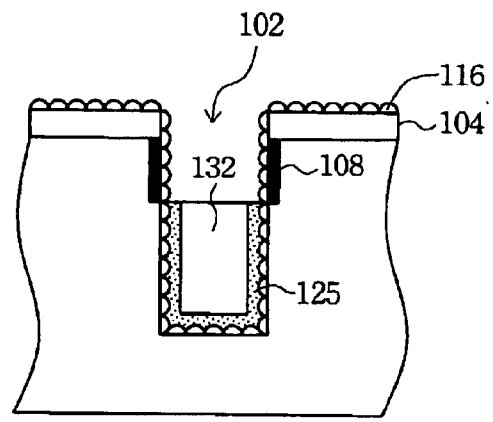

In turn, photoresist coating and recessing processes are carried out. As illustrated in FIG. 1D, a photoresist layer 132 is formed at the bottom of the trench 102 to define the height of a buried plate. Then the upper ASG layer 125 uncovered by the photoresist layer 132 is recessed through a wet etch process.

Figure 1E:
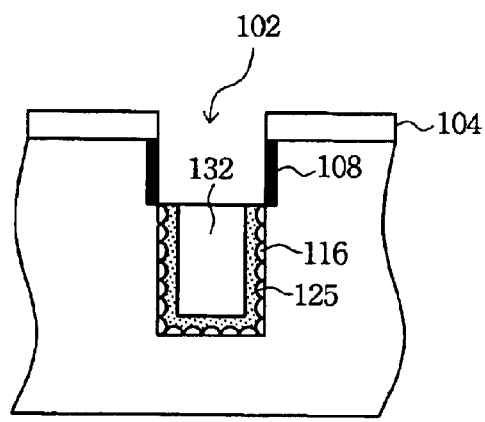

Referring to FIG. 1E, the upper HSG layer 116 uncovered by the photoresist layer 132 is subsequently removed by wet etching. In this step, a potassium hydroxide (KOH)/propanone/water mixture is employed as an etchant to recess the HSG layer 116. The component ratio of the etchant is generally between 0.8/1/3.5 and 1.2/1/4.2. While the component ratio is equal to around 1/1/4, the etch rate selectivity for the HSG layer 116 and the SiGe layer 108 is up to 20:1, as obtained by the etchant. Therefore the etchant successfully strips off the upper HSG layer 116 and does no damage to the trench 102 sidewalls. Furthermore, the roughness of the trench 102 sidewalls is more acceptable for subsequent processes to improve the electrical properties, such as leakage current.

Figure 1F:
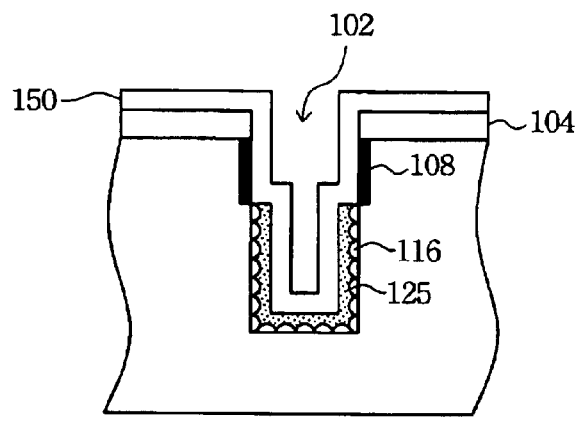

After recessing the upper HSG layer 116 uncovered by the photoresist layer 132, the residual photoresist layer 132 is also removed. As illustrated in FIG. 1F, a cap layer 150 is next deposited thereon. The materials of the cap layer 150 comprise a tetraethylorthosilicate (TEOS) layer.

Figure 1G:
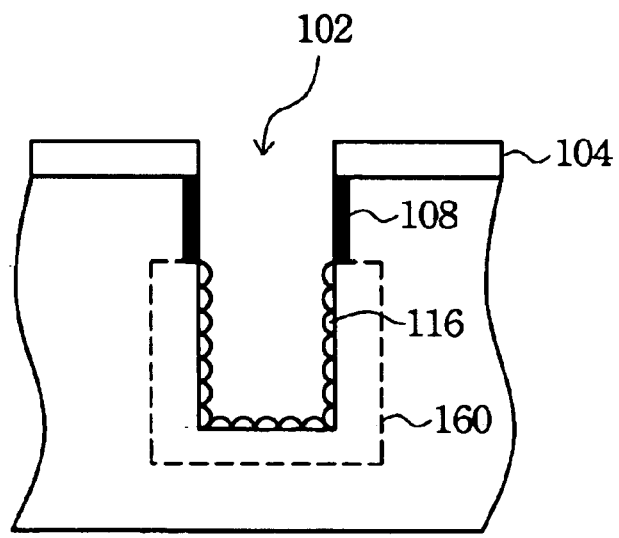

Referring to FIG. 1G, a buried plate 160 is formed thereafter by annealing the ASG layer 125 to drive arsenic atoms into the trench 102. The cap layer 150 and the residual ASG layer 125 are then removed by a wet etch process.

Figure 1H:
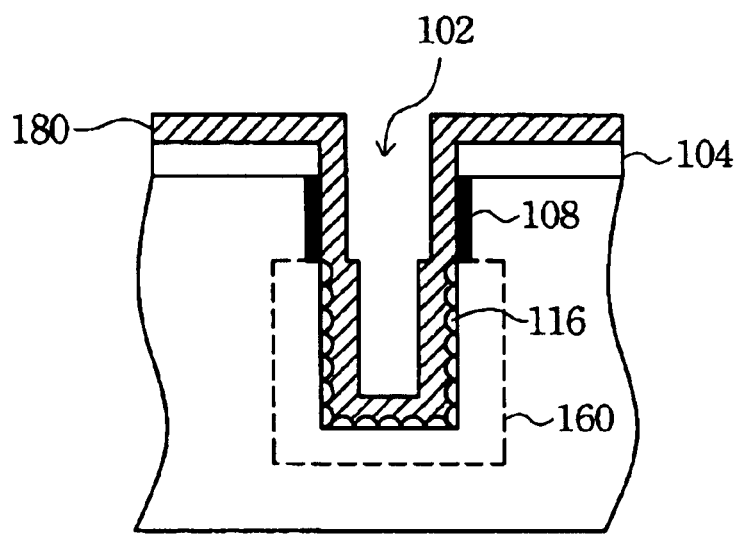

A dielectric layer 180 is eventually deposited on the trench 102 as shown in FIG. 1H. The materials of the dielectric layer comprise an oxide layer and a nitride layer. Referring to FIG. 1H, no etch stop layer, i.e. the SiGe layer 108, exists between the trench 102 and the HSG layer 116, so capacitance degradation of a trench capacitor produced in accordance with the embodiment of the present invention is improved.

According to the aforementioned preferred embodiment of the present invention, an improved method for removal of HSG layer without sacrificing capacitance of storage capacitors is provided. A buried SiGe layer used as an etch stop layer can be selectively formed on only the upper part of the trench by controlling implantation; hence the process is effectively simplified. The buried SiGe layer further enhances the activities of dopants, and in consequence increases the driving current. On the other hand, the HSG layer is removed by wet etching with the KOH-/propanone/water etchant, which has high etch rate selectivity for the HSG layer and the SiGe layer, so that the trench sidewalls are not damaged as the HSG layer is recessed. Besides, the capacitance of storage capacitors is maintained or even increased due to the absence of the etch stop layer existing between the trench and the HSG layer.

While the invention has been particularly shown and described with reference to the preferred embodiments thereof, these are, of course, merely examples to help clarify the invention and are not intended to limit the invention. It will be understood by those skilled in the art that various changes, modifications, and alterations in form and details may be made therein without departing from the spirit and scope of the invention, as set forth in the following claims.

What is claimed is:

1. A method for removal of hemispherical grained silicon in a deep trench, comprising the steps of:

forming an etch stop layer in a collar region of a trench on a substrate;

forming a hemispherical grained silicon (HSG) layer on the trench and the etch stop layer;

forming an arsenic silicon glass (ASG) layer on the HSG layer;

forming a photoresist layer at the bottom of the trench;

removing an upper ASG layer uncovered by the photoresist layer; and removing an upper HSG layer uncovered by the photoresist layer.

2. The method of claim 1, further comprising the steps of:

removing the photoresist layer;

forming a cap layer on the trench;

forming a buried plate in the trench;

removing the residual ASG layer and the cap layer; and forming a dielectric layer.

3. The method of claim 1, wherein the etch stop layer is a buried silicon germanium (SiGe) layer.

4. The method of claim 3, wherein the buried SiGe layer is further served as a mask for forming a bottle-shape trench.

5. The method of claim 3, wherein the buried SiGe layer is formed in the upper part of the trench by implanting germanium atoms into the silicon trench with a predetermined angle.

6. The method of claim 5, wherein the predetermined angle is from about 8 degrees to about 12 degrees.

7. The method of claim 3, wherein the buried SiGe layer is further formed in the upper part of the trench by rapid thermal annealing.

8. The method of claim 1, wherein the step of removing an upper HSG layer uncovered by the photoresist layer comprises a wet etch process.

9. The method of claim 8, wherein the wet etch process comprises employing a potassium hydroxide (KOH)/propanone/water etchant.

10. The method of claim 9, wherein a component ratio of the potassium hydroxide/propanone/water etchant is between around 0.8/1/3.5 and around 1.2/1/4.2, while the component ratio is equal to around 1/1/4, and an etch rate selectivity for the HSG layer and the buried SiGe layer is up to 20:1 by the etchant.

11. The method of claim 1, wherein the step of forming the HSG layer and the ASG layer comprises using a deposition process.

12. The method of claim 1, wherein the step of removing an upper ASG layer uncovered by the photoresist layer comprises a wet etch process.

13. A method for manufacturing a trench capacitor, comprising the steps of:

providing a substrate having at least one trench structure;

forming an etch stop layer in an upper part of the trench on the substrate;

depositing a hemispherical grained silicon (HSG) layer on the trench and the etch stop layer;

depositing an arsenic silicon glass (ASG) layer on the HSG layer;

coating and recessing a photoresist layer on a bottom of the trench;

removing an upper ASG layer uncovered by the photoresist layer;

removing an upper HSG layer uncovered by the photoresist layer;

removing the photoresist layer;

depositing a cap layer on the trench;

forming a buried plate in the trench;

recessing the residual ASG layer and the cap layer; and depositing a dielectric layer.

14. The method of claim 13, wherein the etch stop layer is a buried silicon germanium (SiGe) layer.

15. The method of claim 14, wherein the buried SiGe layer is further served as a mask for forming a bottle-shape trench.

16. The method of claim 14, wherein the step of forming the buried SiGe layer further comprises:

implanting germanium atoms into the upper part of the trench with a predetermined angle; and employing rapid thermal annealing.

17. The method of claim 13, wherein the step of removing an upper HSG layer uncovered by the photoresist layer comprises a wet etch process.

18. The method of claim 17, wherein the wet etch process comprises employing a potassium hydroxide (KOH)/propanone/water etchant.

19. The method of claim 13, wherein the step of forming a buried plate comprises annealing the ASG layer to drive arsenic atoms into the trench.

20. The method of claim 13, wherein the cap layer comprises a tetra ethyl ortho silicate (TEOS) layer.

21. The method of claim 13, wherein the dielectric layer comprises an oxide layer and a nitride layer.

* * * * *